(12) United States Patent
Bang et al.

(10) Patent No.: US 7,902,664 B2
(45) Date of Patent: Mar. 8, 2011

(54) SEMICONDUCTOR PACKAGE HAVING PASSIVE COMPONENT AND SEMICONDUCTOR MEMORY MODULE INCLUDING THE SAME

(75) Inventors: Hyo-jae Bang, Cheonan-si (KR); Dong-chun Lee, Cheoonan-si (KR); Seong-chan Han, Cheonan-si (KR); Kyung-du Kim, Daejeon (KR); Sun-kyu Hwang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 676 days.

(21) Appl. No.: 11/878,084

(22) Filed: Jul. 20, 2007

(65) Prior Publication Data
US 2008/0023812 A1 Jan. 31, 2008

(30) Foreign Application Priority Data
Jul. 28, 2006 (KR) .................. 10-2006-0071574

(51) Int. Cl.
*H01L 23/34* (2006.01)
(52) U.S. Cl. .................. 257/724; 257/723; 257/532
(58) Field of Classification Search .................. 257/723, 257/724, 528, 532, 686
See application file for complete search history.

(56) References Cited

U.S. PATENT DOCUMENTS

| | | | | |
|---|---|---|---|---|
| 2,008,023 A | * | 7/1935 | Krag | 192/66.22 |
| 5,334,875 A | | 8/1994 | Sugano et al. | |
| 5,403,784 A | * | 4/1995 | Hashemi et al. | 29/827 |
| 5,608,261 A | * | 3/1997 | Bhattacharyya et al. | 257/700 |
| 6,046,911 A | * | 4/2000 | Dranchak et al. | 361/784 |
| 6,469,895 B1 | * | 10/2002 | Smith et al. | 361/704 |
| 6,489,686 B2 | * | 12/2002 | Farooq et al. | 257/777 |
| 6,744,131 B1 | * | 6/2004 | Hoang et al. | 257/704 |
| 7,166,917 B2 | * | 1/2007 | Yang et al. | 257/724 |
| 7,224,058 B2 | * | 5/2007 | Fernandez | 257/707 |
| 7,242,092 B2 | * | 7/2007 | Hsu | 257/723 |
| 2004/0160751 A1 | * | 8/2004 | Inagaki et al. | 361/763 |
| 2008/0206927 A1 | * | 8/2008 | Graydon et al. | 438/119 |

FOREIGN PATENT DOCUMENTS

KR 10-2005-0073648 9/2002
KR 10-2003-0015760 2/2003

* cited by examiner

*Primary Examiner* — S. V Clark
(74) *Attorney, Agent, or Firm* — Harness, Dickey & Pierce, P.L.C.

(57) ABSTRACT

Example embodiments relate to a semiconductor package. The semiconductor package may include a mounting substrate, a semiconductor chip mounted to the mounting substrate, at least one passive component passing therethrough and mounted to the mounting substrate, and a cover covering the mounting substrate, the semiconductor chip and the at least one passive component.

12 Claims, 7 Drawing Sheets
(1 of 7 Drawing Sheet(s) Filed in Color)

SEMICONDUCTOR PACKAGE HAVING PASSIVE COMPONENT AND SEMICONDUCTOR MEMORY MODULE INCLUDING THE SAME

PRIORITY STATEMENT

This application claims benefit of Korean Patent Application No. 10-2006-0071574, filed on Jul. 28, 2006, in the Korean Intellectual Property Office, the content of which is incorporated herein by reference in its entirety.

BACKGROUND

1. Field of Art

Example embodiments relate generally to a semiconductor package and a semiconductor memory module including the same, and more particularly, to a semiconductor package having a passive component, and a semiconductor memory module including the same.

2. Description of the Related Art

A computer system may generally include a main board having a plurality of slots, and memory modules inserted in the slots. Each of the memory modules may include a substrate, a plurality of semiconductor packages mounted to the substrate, and tabs electrically connecting the semiconductor packages to the main board. The semiconductor packages may also be built as multi-chip packages each including a plurality of chips. As a result, the multi-chip packages may provide a large capacity memory module.

Further, the memory module may include passive components (e.g., a resistor and/or a capacitor), to smoothly transmit a signal into a semiconductor package. The resistor may be disposed between a tab forming side end and the semiconductor package. The resistor may serve to reduce noise with respect to a signal wave. The capacitor may be provided at an upper end of the module (e.g., a module substrate side end opposite to the tab forming side end). The capacitor may serve as a decoupling capacitor.

During assembling, an operator may manually insert the memory module in a slot of the main board. However, when the memory module is manually inserted, a part of the memory module that the operator handles may be easily damaged and/or abraded. In addition, even when the semiconductor package is formed by a molding process, in which it may reduce damage to the semiconductor package (even if the operator handles the memory module); however, because the resistor and the capacitor are exposed to the outside, the resistor and the capacitor may be easily abraded and/or damaged via contact with the operator. As a result, this may cause the memory module to be defective.

To illustrate the above, FIG. 1 is a photographic image depicting an abrasion (A) of a resistor caused by manual insertion of a memory module. FIG. 2 is a photographic image depicting damage (B) to a capacitor caused by the manual insertion of a memory module.

Moreover, an entire height of the memory module may increase because the resistor and the capacitor may be placed between the tab forming side end and the semiconductor package, and at the side of the substrate opposite to the tab forming side end, respectively. Thus, conventional memory modules may not be reduced in height because of the insertion of the passive component.

SUMMARY

Example embodiments relate to a semiconductor package. The semiconductor package may include a mounting substrate, a semiconductor chip mounted to the mounting substrate, at least one passive component passing therethrough and mounted to the mounting substrate, and a cover covering the mounting substrate, the semiconductor chip and the at least one passive component.

Another example embodiment may provide a semiconductor memory module having a module substrate, a plurality of semiconductor packages mounted on the module substrate, and a plurality of tabs providing electrical signals to each of the semiconductor packages. Each of the semiconductor packages may include a mounting substrate, a semiconductor chip mounted to the mounting substrate, a plurality of passive components passing therethrough the mounting substrate around the semiconductor chip, and a cover covering the mounting substrate, the semiconductor chip, and the plurality of passive components.

Another example embodiment may provide a semiconductor memory module having a module substrate, a plurality of semiconductor packages arranged side by side and mounted on the module substrate, and a plurality of tabs providing electrical signals to each of the semiconductor packages. Each of the semiconductor packages may include a plurality of mounting substrates stacked on one another with predetermined or given intervals therebetween, a plurality of semiconductor chips electrically connected to the mounting substrates, respectively, and a cover covering the stacked mounting substrates and the semiconductor chips. The lowermost mounting substrate contacting the module substrate may include a passive component passing therethrough and fixed therein.

Example embodiments may provide a semiconductor package and/or a semiconductor memory module including a passive component with reduced height.

Example embodiments may provide a semiconductor package and/or a semiconductor memory module for preventing and/or reducing damage to the passive components.

Example embodiments may provide a passive component mounted within a semiconductor package in order to prevent and/or reduce damage or breakage of the passive component when a memory module is manually inserted in a main board. The passive component may be penetratingly fixed in an empty space of a mounting substrate, e.g., a PCB, constituting the semiconductor package, and thus may be mounted therein. Because the passive component may be mounted in the encapsulated semiconductor package, the passive component may avoid direct contact with an operator who may be handling insertion or conveyance thereof, and thereby preventing the semiconductor package from being damaged and/or broken. Further, there may not be any need to provide a separate area for the passive component to the memory module, which may decrease and/or reduce the size (i.e., a height) of the memory module.

Example embodiments may provide a semiconductor memory module capable of preventing passive components from being damaged during manual insertion of the memory module without increasing the height of the memory module.

BRIEF DESCRIPTION OF THE DRAWINGS

The patent or application file contains at least one drawing executed in color. Copies of this patent or patent application publication with color drawing will be provided by the Office upon request and payment of the necessary fee.

The above and other features and advantages of the present invention will become more apparent by describing in detail exemplary embodiments thereof with reference to the attached drawings in which.

DETAILED DESCRIPTION OF EXAMPLE, NON-LIMITING EMBODIMENTS

Example non-limiting embodiments will now be described more fully with reference to the accompanying drawings, in which exemplary embodiments of the invention are shown. Example embodiments may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

It should further be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of exemplary embodiments within the scope of this invention. Rather, for simplicity and clarity of illustration, the dimensions of some of the elements are exaggerated relative to other elements.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, it will be understood that when a layer is referred to as being "on" or "formed over" another layer or substrate, the layer may be directly on the other layer or substrate, or intervening layer(s) may also be present.

Figure 1:
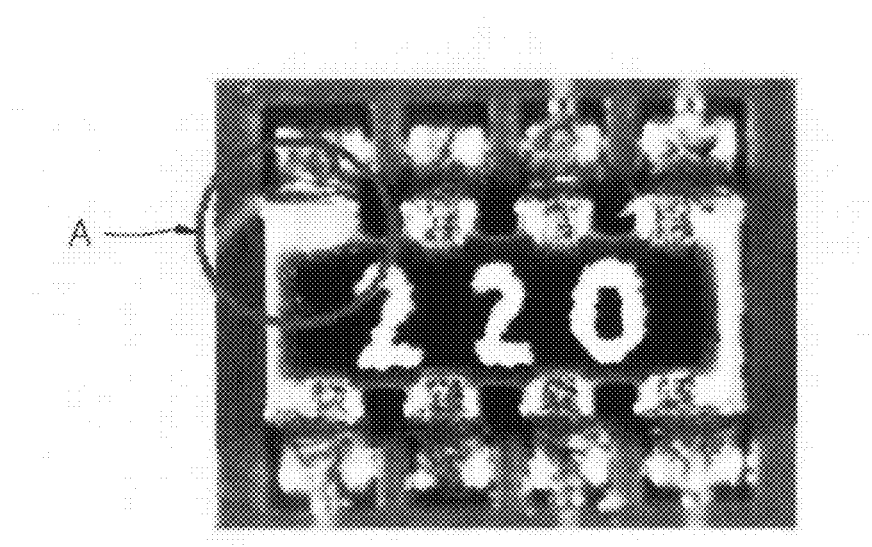
FIG. 1 is a photographic image showing abrasion (A) of a resistor caused by manual insertion of a conventional semiconductor memory module.
Figure 2:
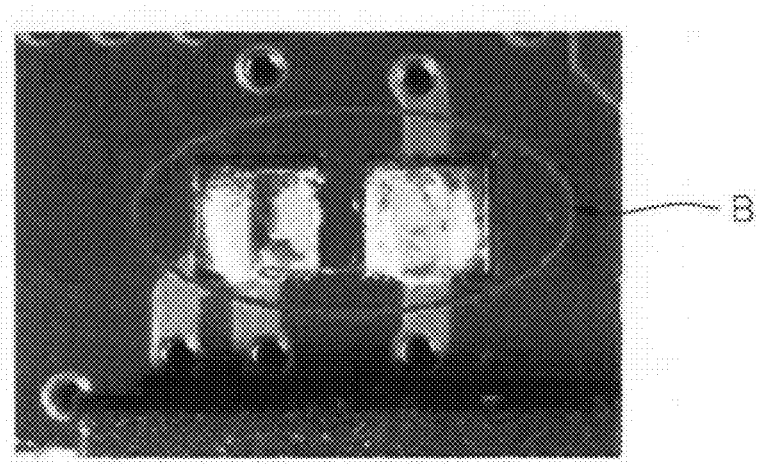
FIG. 2 is a photographic image showing damage (B) to a capacitor caused by the manual insertion of a conventional semiconductor memory module.
Figure 3:
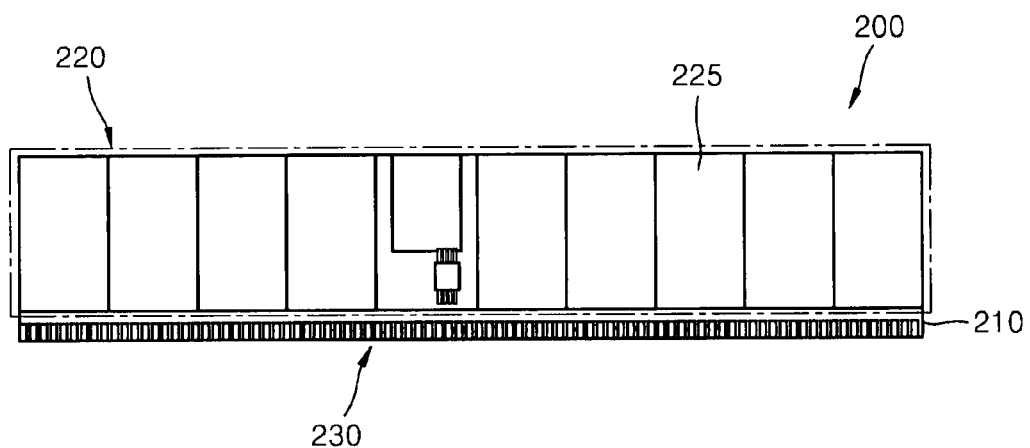
FIG. 3 is a plan view of a memory module according to an example embodiment.

FIG. 3 is a plan view of a memory module 200 according to an example, non-limiting embodiment.

Referring to FIG. 3, the memory module 200 may include a module substrate 210 on which semiconductor packages may be mounted. The module substrate 210 may have a generally rectangular shape so as to be inserted in a long and narrow slot of a computer main board (not shown), for example. However, it should be appreciated that the module substrate 210 may be other shapes, such as, but not limited to, a square and a quadrectangular. The module substrate 210 may be divided into a package area 220 for mounting semiconductor packages, and a tab area 230 to be inserted in the slot (not shown). The tab area 230 may transmit an electrical signal to the package area 220. The tab area 230 may be arranged along one long side of the module substrate 210, and a plurality of semiconductor packages 225 may be arranged side by side in a row in the package area 220 above the tab area 230. It should be appreciated that the semiconductor packages 225 may be arranged in other arrangements. In an example embodiment, a long axis of each of the semiconductor packages 225 may be parallel to a short axis of the module substrate 210. In a further example embodiment, one short side of each semiconductor package 225 may face the tab area 230 without a gap therebetween, and the other short side thereof may be nearly adjacent with a long side (a side opposite to the tab area 230) of the module substrate 210. That is, a passive component may not be placed on the module substrate 210 of the memory module 200, but may be placed within the semiconductor package 225. Accordingly, there may not be any need to define an area for mounting the passive component in the module substrate 210.

Figure 4:
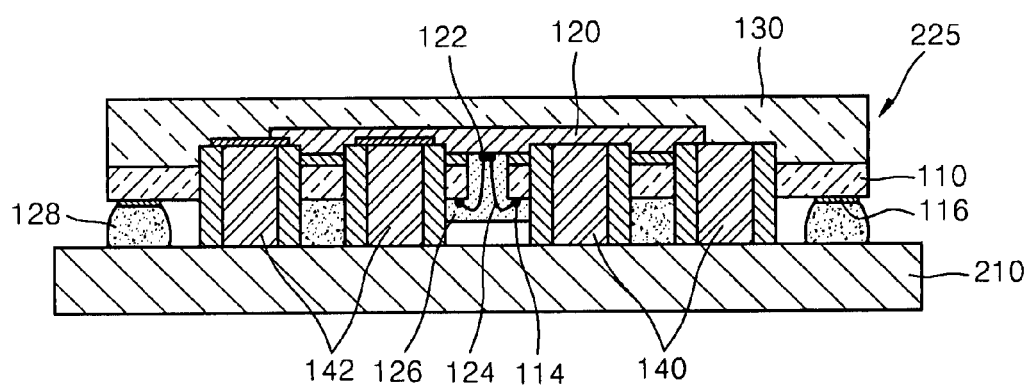
FIG. 4 is a cross-sectional view of a semiconductor package including a passive component according to an example embodiment.

FIG. 4 is a cross-sectional view of one of the semiconductor packages 225 including a passive component according to an example, non-limiting embodiment. Referring to FIG. 4, the semiconductor package 225 including the passive component may include a mounting substrate 110, for example, a printed circuit board (PCB), and a semiconductor chip 120 bonded to the mounting substrate 110.

Figure 5:
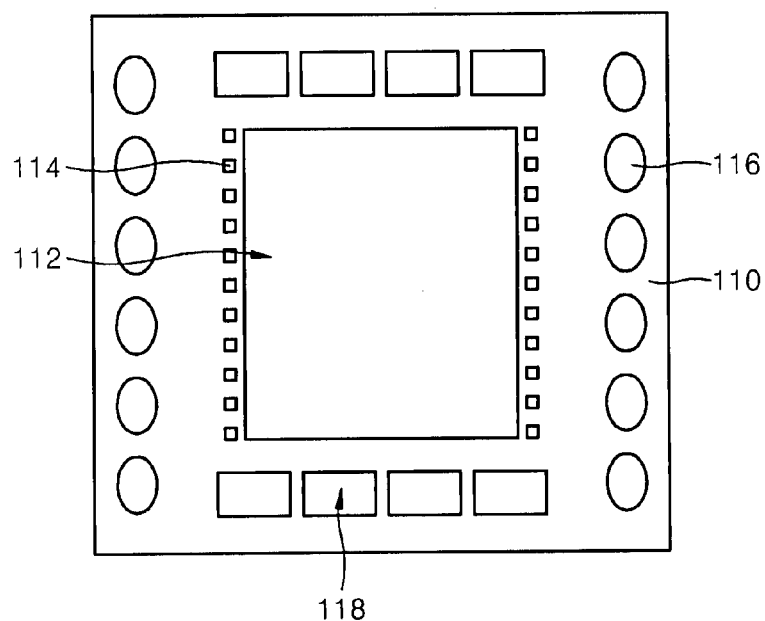
FIG. 5 is a plan view of a printed circuit board constituting a semiconductor package according to an example embodiment.

FIG. 5 is a plan view of the mounting substrate 110 according to an example, non-limiting embodiment. As illustrated in FIG. 5, the mounting substrate 110 may have a first opening 112 at its center, in which a semiconductor chip (not shown) may be placed. The first opening 112 may be smaller than the semiconductor chip (not shown), and may have, for example, a generally quadrangular shape. It should be appreciated that the first opening may be formed in other shapes. In an example embodiment, a plurality of pad electrodes 114 may be arranged on the mounting substrate 110 along first opposite sides of the first opening 112. The first opposite sides may be lengthwise opposite sides of the first opening 112. The pad electrodes 114 may be electrically connected to pads of the semiconductor chip (not shown). A plurality of ball pads 116 for mounting conductive balls, for example, may be provided outside the pad electrodes 114 on the mounting substrate 110. The ball pads 116 may be electrically connected to the pad electrodes 114 by connection lines (not shown) formed within the mounting substrate 110. It should be appreciated that other connections besides ball pads may be employed, such as, but not limited to, solder bumps, stud bumps and/or other support connection members.

A second opening 118 for mounting a passive component may be provided on the mounting substrate 110 along each of second opposite sides of the first opening 112. The second opposite sides may be the side perpendicular to the first opposite sides, and may be crosswise sides of the first opening 112, which face each other. A plurality of second openings 118 may be provided along each of the second opposite sides so that a plurality of passive components may be individually inserted. The second openings 118 may be formed by punching, for example. However, it should be appreciated that other methods of forming the second openings may be employed.

The second opening 118 may be formed in an empty region around the first opening 112, without further providing a separate area for the second opening 118 to the mounting substrate 110. Thus, no expansion in area of the mounting substrate 110 due to the second opening 118 may be required.

Referring back to FIG. 4, a semiconductor chip 120 may be provided on the mounting substrate 110. The semiconductor chip 120 may have a structure including, for example, a plurality of pads 122. The semiconductor chip 120 may be provided on the mounting substrate 110 with its pads 122 exposed through the first opening 112 of the mounting substrate 110. The pads 122 of the semiconductor chip 120 may be connected to the pad electrodes 114 of the mounting substrate 110 by wires 124, for example. The exposed pads 122 of the semiconductor chip 120, the wires 124, and the pad electrodes 114 of the mounting substrate 110 may be encapsulated by a sealing resin 126. The conductive balls 128 may be attached to the ball pads 116 of the mounting substrate 110, so that the mounting substrate 110 to which the semiconductor package 225 may be bonded may be loaded on the substrate 210 of the memory module 200 by the conductive balls 128. In order to ensure a space for the sealing resin 126 and the semiconductor chip 120, the conductive balls 128 may have a height the same as or greater than the sum of the height of the sealing resin 126 and the height of the semiconductor chip 120. Passive components, for example, a capacitor 140 and a resistor 142, may be inserted in the second openings 118 of the mounting substrate 110. A package cover 130 may cover the mounting substrate 110 including the fixed passive components, thereby completing a board on chip (BOC) package including the passive components 140 and 142.

Because the passive components (e.g., the capacitor 140 and/or the resistor 142) may be through-hole components, electrical interference may be greatly reduced as compared to the case where the passive components may be bonded to the mounting substrate 110 (e.g., the passive components are surface mounted). In other words, if the passive components are bonded to the mounting substrate 110, interference may necessarily occur by a connection member (or other members) that connects the semiconductor chip 120 to the mounting substrate 110. Further, the passive components bonded to the mounting substrate 110 may increase the entire height of the semiconductor package 225. However, in example non-limiting embodiments, the electrical interference and the height of the semiconductor package 225 may be reduced because the passive components inserted therethrough and fixed to the mounting substrate 110 may be completely electrically separated from the semiconductor chip 120. Moreover, when the capacitor 140 is mounted in the semiconductor package 225, the distance between the semiconductor chip 120 and the capacitor 140 may be shorter than in the case where the capacitor 140 may be provided outside the semiconductor package 225, so that a low inductance may be obtained. Consequently, this may result in the operating speed of the memory module 220 to be improved.

Figure 6:
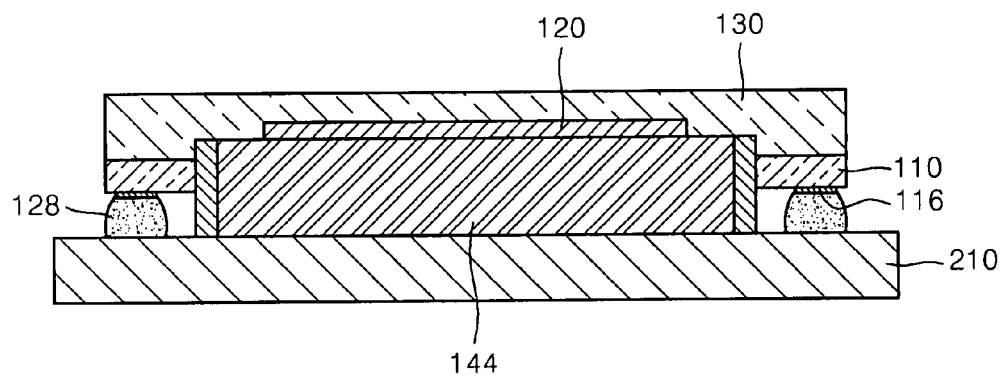
FIG. 6 is a cross-sectional view of a semiconductor package including a large-sized passive component according to another example embodiment.

FIG. 6 is a cross-sectional view of a semiconductor package including a passive component 144 according to another example, non-limiting embodiment. Referring to FIG. 6, the passive component 144 may be large enough to function as a plurality of passive components.

Figure 7:
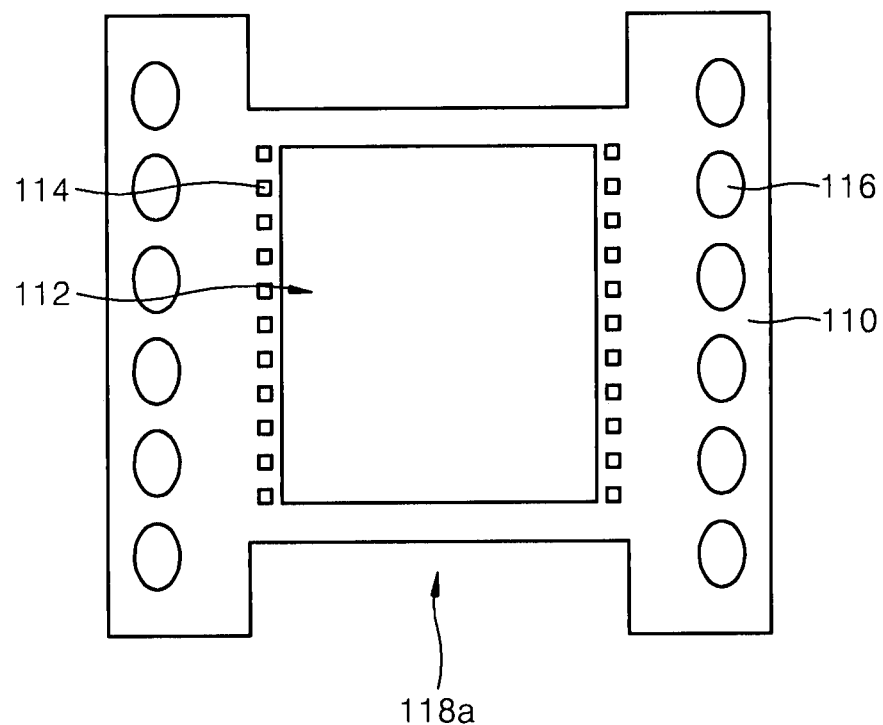
FIG. 7 is a plan view of a printed circuit board in which the large-sized passive component of FIG. 6 may be inserted according to an example embodiment.

FIG. 7 is a plan view of a mounting substrate 110 in which the large-sized passive component 144 of FIG. 6 may be inserted, according to another example, non-limiting embodiment. Referring to FIG. 7, the large-sized passive component 144 may be inserted in a second opening 118*a* that may be formed as a generally rectangular shape so that the large passive component 144 may be received therein. It should be appreciated that other shapes may be employed depending on the shape of the large-sized passive component 144. The generally rectangular second opening 118*a* may also have a size large enough to include all the second openings 118 of FIG. 5, and may be formed as a routing type, for example.

Figure 8:
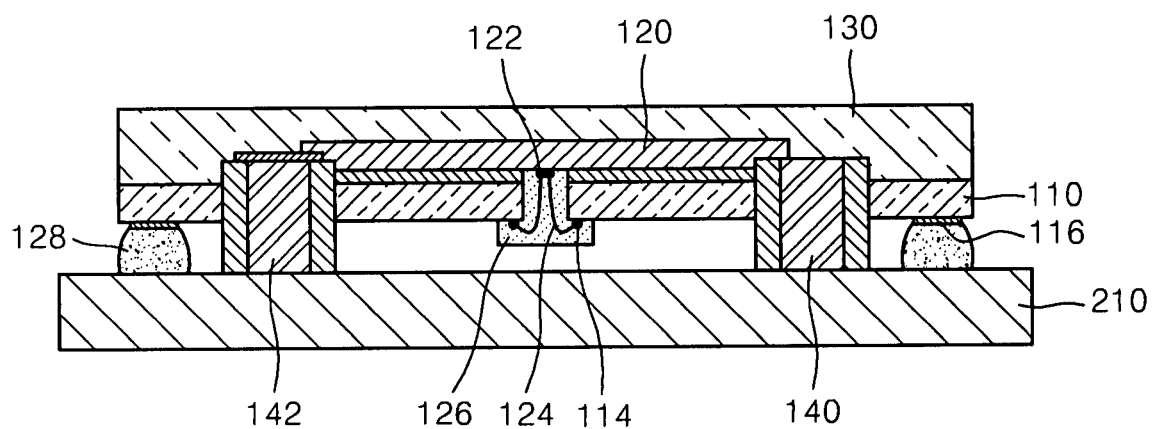
FIG. 8 is a cross-sectional view of a semiconductor package including a passive component according to another example embodiment.
Figure 9:
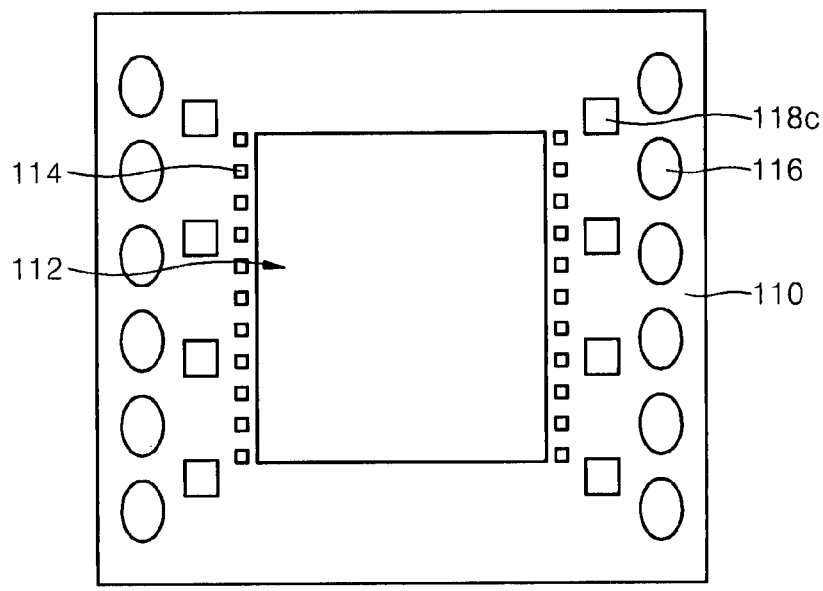
FIG. 9 is a plan view of a printed circuit board according to another example embodiment.

FIG. 8 is a cross-sectional view of a semiconductor package including a passive component according to another example, non-limiting embodiment. FIG. 9 is a plan view of a PCB 110 according to another example, non-limiting embodiment. As illustrated in FIGS. 8 and 9, when the distance between a semiconductor chip 120 and a plurality of ball pads 116 is sufficient, second openings 118*c* may be formed between the ball pads 116 and the pad electrode 114 on the mounting substrate 110. Passive components 140 and 142 may be provided within the second openings 118*c*.

Figure 10:
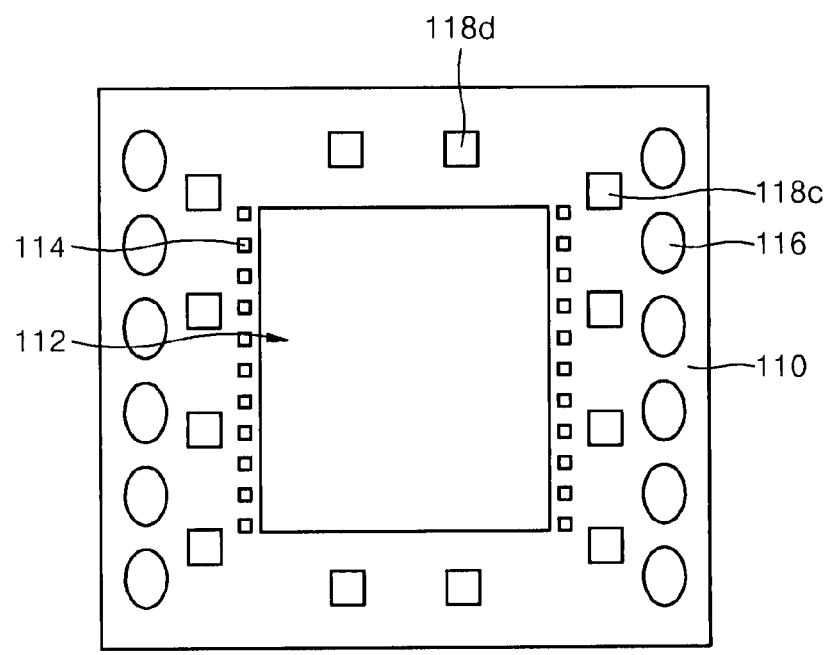
FIG. 10 is a plan view of a printed circuit board according to another example embodiment.

FIG. 10 is a plan view of a PCB 110 according to another example, non-limiting embodiment. Referring to FIG. 10, passive components 140 and 142 may be formed not only between the semiconductor chip 120 and the ball pads 116 but also in any empty area of the mounting substrate 110 sufficient to install the passive components 140 and 142.

Because the passive components 140 and 142 may be provided in the empty area of the mounting substrate 110, the passive components 140 and 142 may support and fix the mounting substrate 110. Thus, even if predetermined or given pressure (e.g., molding pressure) is applied during formation of an upper cover 130, 132, a crack (or break) may not be formed on the semiconductor package 225.

Figure 11:
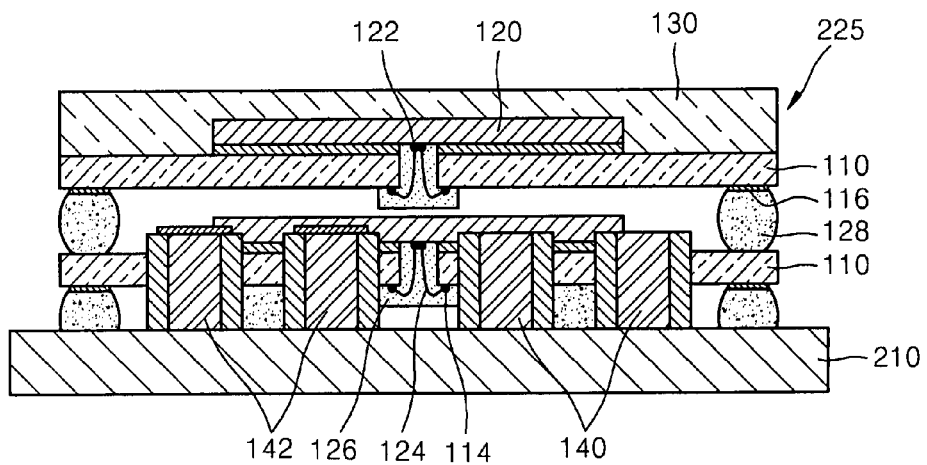
FIG. 11 is a cross-sectional view of a dual stack package (DSP) including a passive component according to another example embodiment.
Figure 12:
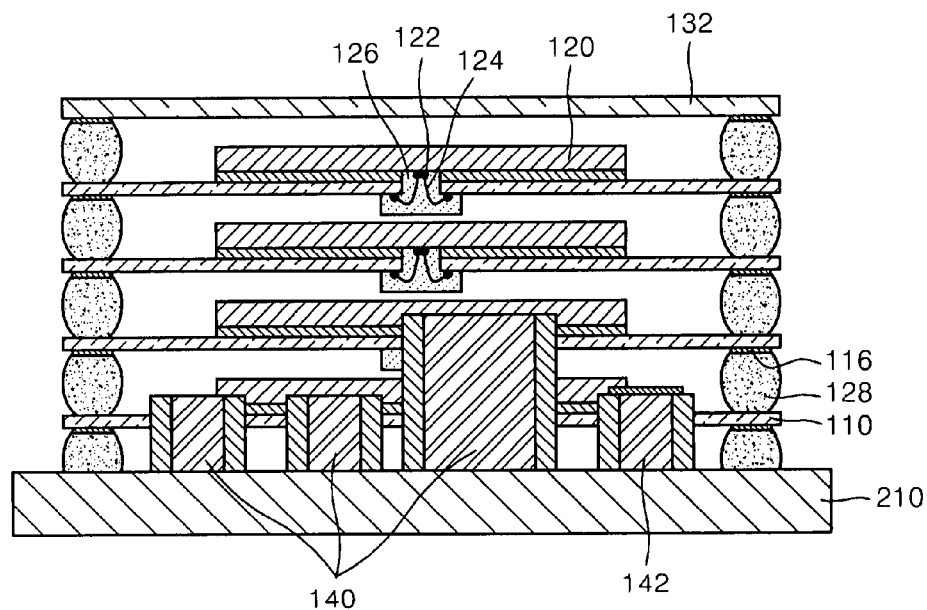
FIG. 12 is a cross-sectional view of a quad stack package (QSP) including a passive component according to another example embodiment.

Referring to FIGS. 11 and 12, the semiconductor package 225 may be configured as a stack package. FIG. 11 is a cross-sectional view of a dual stack package (DSP) 225 including passive components according to another example, non-limiting embodiment. FIG. 12 is a cross-sectional view of a quad stack package (QSP) including passive components according to another example, non-limiting embodiment. FIGS. 11 and 12 may illustrate, before formation of a cover 130 of a unit BOC package of FIG. 4, one or more unit BOC packages being additionally stacked thereon, and then the cover 130 or 132 covers the uppermost BOC package, and thus, forming the stack package. When two semiconductor packages are mounted as illustrated in FIG. 11 (i.e., in the case of a dual stack package (DSP)), the cover 130 may be formed of a molding resin. It should be appreciated that other materials may be employed to form the cover. Further, when four semiconductor packages are stacked as illustrated in FIG. 12 (i.e., in the case of a quad stack package (QSP)), a lid may be used as the PCB, and a bare PCB may be used as the cover 132. In an example embodiment, the bare PCB may refer to a substrate having no circuits. The stacked PCBs 110 may be electrically connected to one another by conductive balls 128 bonded to bottom surfaces of the mounting substrates 110. When the stack package is employed as the semiconductor package 225, the passive components 140, 142 or 144 may be provided within a base (lowermost) mounting substrate 110 electrically connected to the substrate 210 of the memory module 200.

Figure 13:
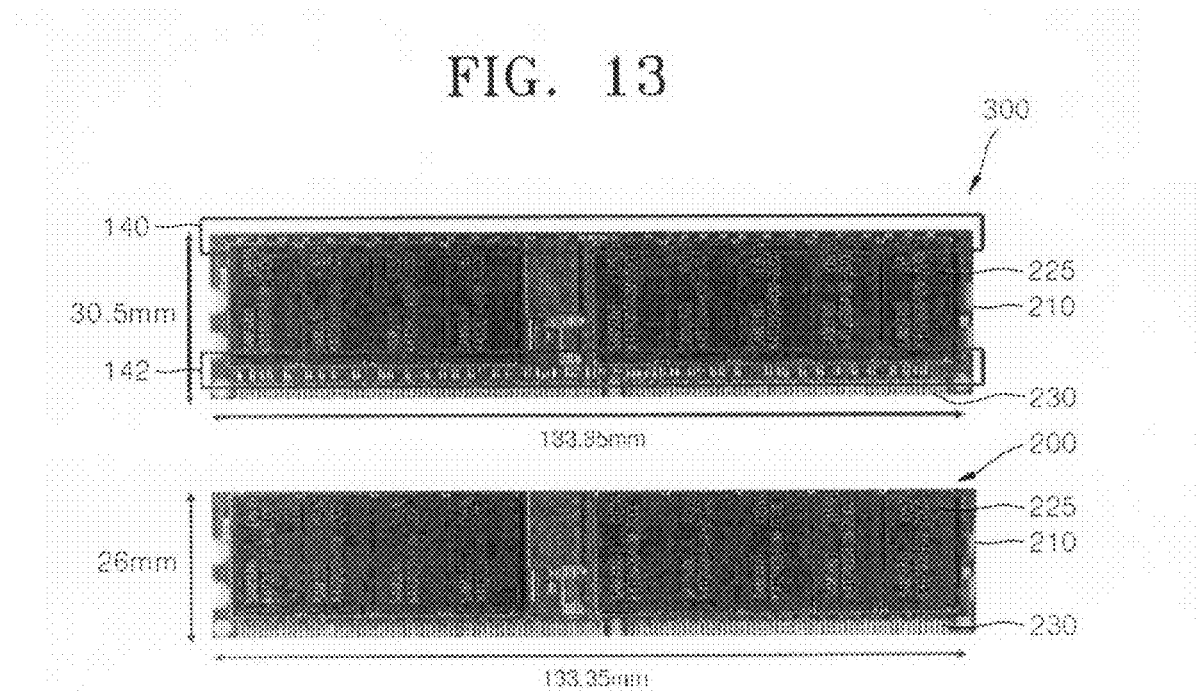
FIG. 13 illustrates a photographic image of a semiconductor memory module according to an example embodiment and a photographic image of a conventional semiconductor memory module for comparing the heights of the respective memory modules.

FIG. 13 illustrates photographic images for comparing heights between a memory module 200 according to an example, non-limiting embodiment and a conventional memory module 300. The area of the conventional memory module may be, for example, 133.35 mm×30.5 mm as the passive components 140 and 142 may be provided at an upper end of the semiconductor package 225 and between the semiconductor package 225 and the tab region 230, respectively.

In comparison, example embodiments in which the passive components 140 and 142 may be mounted in the semiconductor package 225, may depict the size of the memory module 200 being smaller than that of the conventional memory module 300 by the area occupied by the passive components 140 and 142 in the conventional memory module 300. For example, the area of the memory module 200 according to an example embodiment may be approximately 133.35 mm×26 mm. Consequently, one may appreciate that the height of the memory module 200 according to example embodiments may be smaller than that of the conventional memory module 300 by about 4 mm.

It should further be appreciated that other dimension size of the memory module may be employed.

Figure 14:
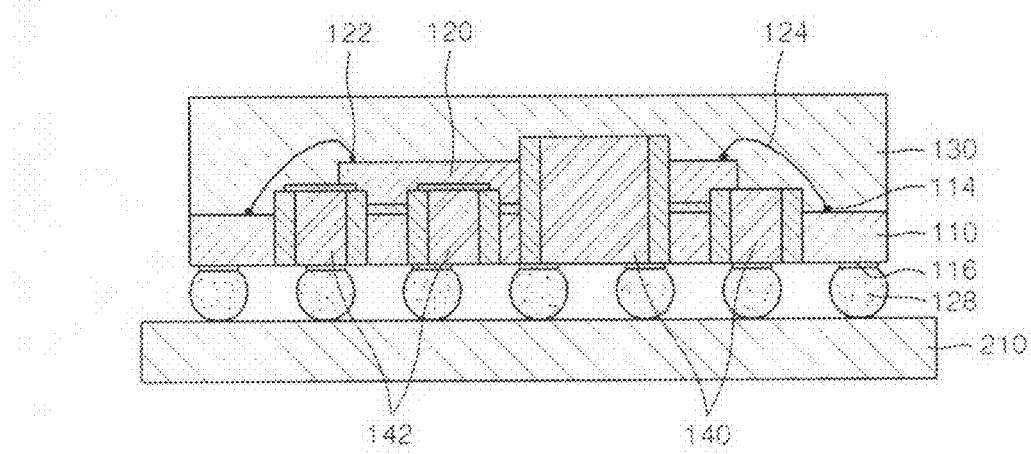
FIG. 14 is a cross-sectional view of a ball grid array (BGA) package including a passive component according to another example embodiment.

Although the semiconductor package in example embodiments described above may be a BOC package, it should be appreciated that a general ball grid array (BGA) package may be used as illustrated in FIG. 14, or other types of packages may also be used.

Although the first opening for exposing the pads of the semiconductor chip and the second opening for insertion of the passive component may be described as quadrangular structures, example embodiments may not be limited thereto, but various other types of openings may be formed.

Further, although the PCB may be used as a substrate for mounting of the semiconductor chip as described in example embodiments above, mounting members such as a ceramic, a lid frame, a circuit tape, a circuit film or the like may be used. Even though the conductive balls may be employed as an electrical connection unit for connecting to an external device, it should be appreciated that bumps or other connection units may be used.

In accordance to other example embodiments, an opening may be formed in a PCB to which a semiconductor package may be mounted, and in which a passive component may be mounted within the opening. However, it should be appreciated that the passive component may be mounted in the semiconductor package.

Even if a memory module including the semiconductor package may be manually inserted in a main board, the passive components mounted in the semiconductor package may not be damaged and/or corroded.

Further, because the passive component may be mounted in a predetermined or given empty area of the PCB, a separate area for the passive component may not be needed. Thus, a size of the memory module substrate may be reduced by an area occupied by a passive component of a conventional memory module. Accordingly, a compact computer system may be implemented.

Further, because the passive component may be inserted through and fixed to the empty area of the PCB, the passive component may serve to support the printed circuit board even when molding pressure is applied thereto in molding the semiconductor package, so that the semiconductor package may be protected.

Further, because the passive component may be a through-hole component penetrating the PCB, the height of the semiconductor package may be reduced.

While example non-limiting embodiments have been particularly shown and described with reference to exemplary embodiments thereof, it will be understood by those of ordinary skill in the art that various changes in form and details may be made therein without departing from the spirit and scope of example embodiments as defined by the following claims.

What is claimed is:

1. A semiconductor memory module, comprising:
   a module substrate;
   a plurality of semiconductor packages mounted on the module substrate; and
   a plurality of tabs providing electrical signals to each of the semiconductor packages,
   wherein each of the semiconductor packages includes:
      a mounting substrate;
      a semiconductor chip mounted to the mounting substrate;
      a plurality of passive components passing therethrough the mounting substrate around the semiconductor chip; and
      a cover covering the mounting substrate, the semiconductor chip, and the plurality of passive components,
   wherein:
   the mounting substrate includes an opening at a center thereof, and the semiconductor chip is bonded to the mounting substrate with pads thereof exposed through the opening,
   the mounting substrate further includes a pad electrode array having a plurality of pad electrodes at an edge of the opening,
   the semiconductor package further includes wires electrically connecting the pad electrodes with the pads of the semiconductor chip, and a sealing resin encapsulating the pads of the semiconductor chip and the wires, and
   the plurality of passive components are arranged in a direction crossing the pad electrode array.

2. The semiconductor memory module of claim 1, wherein the mounting substrate includes:
   ball pads formed on a surface opposite to a bonding surface of the semiconductor chip; and
   conductive balls attached to the ball pads.

3. A semiconductor memory module, comprising:
   a module substrate;
   a plurality of semiconductor packages mounted on the module substrate; and
   a plurality of tabs providing electrical signals to each of the semiconductor packages,
   wherein each of the semiconductor packages includes:
      a mounting substrate;
      a semiconductor chip mounted to the mounting substrate;
      a plurality of passive components passing therethrough the mounting substrate around the semiconductor chip; and
      a cover covering the mounting substrate, the semiconductor chip, and the plurality of passive components,
   wherein:

the mounting substrate includes an opening at a center thereof, and the semiconductor chip is bonded to the mounting substrate with pads thereof exposed through the opening, the mounting substrate further includes a pad electrode array having a plurality of pad electrodes at an edge of the opening, the semiconductor package further includes wires electrically connecting the pad electrodes with the pads of the semiconductor chip, and a sealing resin encapsulating the pads of the semiconductor chip and the wires, and the plurality of passive components are arranged parallel to the pad electrode array.

4. The semiconductor memory module of claim 1, wherein the semiconductor package further includes at least one additional mounting substrate to which the semiconductor chip is bonded, the additional mounting substrate being interposed between the cover and the mounting substrate to which the semiconductor chip is bonded.

5. The semiconductor memory module of claim 1, wherein the cover is formed of a molding resin or is a bare printed circuit board.

6. A semiconductor memory module, comprising:
a module substrate;
a plurality of semiconductor packages mounted on the module substrate; and
a plurality of tabs providing electrical signals to each of the semiconductor packages,
wherein each of the semiconductor packages includes:
a mounting substrate;
a semiconductor chip mounted to the mounting substrate;
a plurality of passive components passing therethrough the mounting substrate around the semiconductor chip; and
a cover covering the mounting substrate, the semiconductor chip, and the plurality of passive components,
wherein the module substrate includes two opposite parallel sides, and the tabs are arranged at one of the two opposite sides of the module substrate, and
wherein the packages are loaded on the module substrate such that one side of each of the packages is aligned with one of the two opposite sides of the module substrate, and the other side faces the tabs without a gap therebetween.

7. A semiconductor memory module comprising:
a module substrate;
a plurality of semiconductor packages arranged side by side and mounted on the module substrate; and
a plurality of tabs providing electrical signals to each of the semiconductor packages,
wherein each of the semiconductor packages includes:
a plurality of mounting substrates stacked on one another with intervals therebetween;
a plurality of semiconductor chips electrically connected to the mounting substrates, respectively; and
a cover covering the stacked mounting substrates and the semiconductor chips,
wherein the lowermost mounting substrate contacting the module substrate includes a passive component passing therethrough and fixed therein.

8. The semiconductor memory module of claim 7, wherein the lowermost mounting substrate has an opening around the semiconductor chip, the passive component being inserted in the opening.

9. The semiconductor memory module of claim 7, wherein the module substrate includes two opposite parallel sides, and the tabs are arranged at one of the two opposite sides,
wherein the packages are loaded on the module substrate such that one side end of the packages is flush with one of the two opposite sides of the module substrate, and the other side end of the packages faces the tabs without a gap therebetween.

10. The semiconductor memory module of claim 3, wherein the mounting substrate includes:
ball pads formed on a surface opposite to a bonding surface of the semiconductor chip; and
conductive balls attached to the ball pads.

11. The semiconductor memory module of claim 3, wherein the semiconductor package further includes at least one additional mounting substrate to which the semiconductor chip is bonded, the additional mounting substrate being interposed between the cover and the mounting substrate to which the semiconductor chip is bonded.

12. The semiconductor memory module of claim 3, wherein the cover is formed of a molding resin or is a bare printed circuit board.

* * * * *